United States Patent
Duesman et al.

(10) Patent No.: US 6,230,292 B1
(45) Date of Patent: *May 8, 2001

(54) DEVICES AND METHOD FOR TESTING CELL MARGIN OF MEMORY DEVICES

(75) Inventors: Kevin G. Duesman; Edward J. Heitzeberg, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/451,172

(22) Filed: Nov. 30, 1999

Related U.S. Application Data

(63) Continuation of application No. 08/822,074, filed on Mar. 20, 1997, now Pat. No. 6,105,152, which is a continuation of application No. 08/627,915, filed on Apr. 2, 1996, now abandoned, which is a continuation of application No. 08/047,115, filed on Apr. 13, 1993, now abandoned.

(51) Int. Cl.$^7$ ................................................... G11C 24/00
(52) U.S. Cl. ........................................... 714/718; 365/201
(58) Field of Search ................................ 714/718, 719, 714/721; 365/201

(56) References Cited

U.S. PATENT DOCUMENTS

| | | | |
|---|---|---|---|
| 3,047,841 | 7/1962 | Lundi | 340/167 |
| 3,252,097 | 5/1966 | Homan | 328/56 |
| 3,548,177 | 12/1970 | Hartlipp et al. | 235/153 |
| 3,633,174 | 1/1972 | Griffin | 340/172.5 |
| 3,737,637 | 6/1973 | Frankeny et al. | 235/153.4 |
| 3,916,306 | 10/1975 | Patti | 324/73 |
| 4,025,768 | 5/1977 | Missios et al. | 235/153 |
| 4,081,701 | 3/1978 | White, Jr. et al. | 307/355 |
| 4,239,993 | 12/1980 | McAlexander, III et al. | 307/355 |
| 4,502,140 | 2/1985 | Proebsting | 371/28 |
| 4,527,254 | 7/1985 | Ryan et al. | 365/51 |
| 4,654,849 | 3/1987 | White, Jr. et al. | 714/718 |
| 4,849,973 * | 7/1989 | Kubota | 714/718 |
| 4,855,628 | 8/1989 | Jun | 307/530 |
| 4,860,259 | 8/1989 | Tobita | 365/201 |
| 4,868,823 | 9/1989 | White, Jr. et al. | 714/720 |
| 5,023,840 | 6/1991 | Tobita | 365/201 |
| 5,043,945 | 8/1991 | Bader | 365/203 |
| 5,216,678 | 6/1993 | Nawaki | 714/819 |
| 5,223,792 | 6/1993 | El-Ayat et al. | 324/158 R |
| 5,265,057 | 11/1993 | Furuyama et al. | 365/201 |
| 5,276,647 | 1/1994 | Matsui et al. | 365/201 |
| 5,291,449 | 3/1994 | Dehara | 365/201 |
| 5,299,163 | 3/1994 | Mortigami | 365/201 |
| 5,315,554 * | 5/1994 | Namba | 365/201 |

(List continued on next page.)

Primary Examiner—Emmanuel L. Moise
(74) Attorney, Agent, or Firm—TraskBritt

(57) ABSTRACT

Methods for testing semiconductor memory devices are performed during the writing and reading of test information to and from memory cells. During the tests, operational parameters such as commencement of timing signals and the voltage levels thereof which are employed to activate components of a memory device are controllably adjusted in an effort to intentionally imbalance or alter the voltage differential appearing on the bit lines. If the memory device has a defect, the voltage levels on the bit lines are altered to such a degree that the sense amplifier, although properly sensing the voltage differential, incorrectly senses the intended test information stored in the memory cells. As the parameters are manipulated, the test information written from the memory cell and error signals are generated when the information is not the same. Circuitry for performing methods for testing semiconductor memory devices during the writing and reading of test information to and from memory cells is also disclosed. Such circuitry includes signal generation circuitry for generating timing signals, preparatory and control circuitry for preparing and selecting individual memory cells, word lines and bit lines for read and write operations, and analyzing circuitry to evaluate the results of the sense amplifier and the data written into and read from the memory cells and to discern defects in the memory cells.

35 Claims, 5 Drawing Sheets

U.S. PATENT DOCUMENTS

| | | | |
|---|---|---|---|
| 5,339,273 | 8/1994 | Taguchi | 365/201 |
| 5,343,432 | 8/1994 | Matsou et al. | 365/203 |
| 5,357,572 | 10/1994 | Bianco et al. | 380/23 |
| 5,377,152 | 12/1994 | Kushiyama et al. | 365/210 |
| 5,570,317 * | 10/1996 | Rosen et al. | 365/201 |
| 5,761,451 | 6/1998 | Abert et al. | 395/293 |

* cited by examiner

DEVICES AND METHOD FOR TESTING CELL MARGIN OF MEMORY DEVICES

CROSS REFERENCE TO RELATED APPLICATION

This application is a continuation of application Ser. No. 08/822,074, filed Mar. 20, 1997, now U.S. Pat. No. 6,105,152, which is a continuation of application Ser. No. 08/627,915, filed Apr. 2, 1996, abandoned, which is a continuation of application Ser. No. 08/047,115, filed Apr. 13, 1993, abandoned.

BACKGROUND OF THE INVENTION

1. Field of the Invention

This invention relates to methods for testing semiconductor devices.

2. State of the Art

Processed semiconductor wafers typically comprise an array of substantially isolated integrated circuitry which are individually referred to as "dice" or "chips". The die comprise the finished circuitry components of, for example, memory circuits such as DRAM and SRAM chips.

After a semiconductor wafer has been fabricated, not all dice provided on the wafer prove operable, resulting in less than 100% yield. Accordingly, individual dice must be tested for functionality. The typical test procedure for DRAM or SRAM circuitry is to first etch the upper protective passivation layer to expose desired bonding pads on the individual dice. Thereafter, the wafer is subjected to test probing whereby the individual dice are tested for satisfactory operation. Inoperable dice are typically identified by an ink mark. After testing, the wafer is severed between the individual dice, and the operable, non-marked dice are collected.

Memory chips are typically designed with redundant memory cells used to replace identifiable, defective memory cells. The redundant cells are provided within an array of memory cells, and are designed to be fusibly linked with the array to replace any of the defective cells. This process can be carried out after this initial testing. These "corrected" dice are then added to the batch of "operable" die.

The "corrected" and "operable" individual dice are assembled in final packages of either ceramic or plastic. After packaging, the dice are loaded into burn-in boards which comprise printed circuit boards having individual sockets connected in parallel. The burn-in boards are then put into a burn-in oven, and the parts are subjected to burn-in testing. During burn-in, the dice are operated for a period of time at different temperature cycles, including high temperatures and accelerated voltages. The dice are stressed to accelerate their lives in an effort to determine when the dice are likely to fail. Manufacturers predict early failures, known as "infant mortalities", to occur within a predetermined period of time of the burn-in cycle. Burn-in testing is conducted for a period of time sufficient to reveal infant mortalities. For example, if infant mortalities are expected to occur within 48 hours of burn-in testing, the burn-in tests can be completed within this time period.

According to the above testing procedures, the dice are subjected to a test before severing, and a second test after severing and packaging of the individual die. Under present testing conditions, completely defective dice are often discovered during the initial testing procedures. If possible, defective memory cells are replaced with redundant memory cells to correct the dice. The "operable" and "corrected" dice then undergo a burn-in testing cycle which is commonly a two-day event. Essentially, the burn-in testing discovers weaknesses in the chip which, while not completely defective, will inhibit normal operation, occasionally fail, or entirely fail within a short period of time after fabrication. Burn-in testing is designed to reveal these latent defects.

However, the burn-in testing stage occurs late in the manufacturing process after the dice have already been severed and individually packaged. At this stage, it is often too late to replace inoperable memory cells with redundant memory cells. Furthermore, for those dice which do not successfully pass the burn-in testing stage (i.e., due to some latent defect), the manufacturer has already incurred the expense of packaging defective dice. Another consideration is that the burn-in testing stage typically takes from 12 to 48 hours to discern whether a die is defective. While this is a reasonable time frame, it would be advantageous to have a shorter time frame.

The second test (i.e., after severing and packaging) also identifies dice which fail due to a weakness, typically due to a defect, but are not observable in the test probing phase described above.

Accordingly, it is desired to develop testing techniques which would reveal weaknesses or other latent defects at an earlier stage in the manufacturing process so that the manufacturer has an opportunity to correct the defect before severing and final packaging. It is also desirable to conduct such tests within a short time frame to further increase manufacturing efficiency and timeliness.

SUMMARY OF THE INVENTION

The present invention teaches circuitry and multiple methods for testing semiconductor devices to reveal weaknesses or other latent defects prior to assembly, and in a much shorter time frame than with conventional burn-in testing processes. The signal generation circuitry, preparatory and control circuitry described, and the test methods used stress the semiconductor device by purposefully altering one or any of: 1) the start times of the timing signals in relation to commencement of a cycle, 2) the durations of the timing signals, and 3) the voltage levels of the timing signals, to values outside the normal operating parameters of the device. In this way, if any weaknesses or defects are present within the device, the output of the device will reveal an error. The output of the device is then checked by analyzing circuitry to determine if the device has any weaknesses or defects by comparing the output with the input.

One significant advantage of this invention is that for each correctable weakness or defect discovered, a repair or replacement may occur prior to assembly to prevent the device from failing later. As a result, burn-in testing is conducted only on those chips which have proven satisfactory in the disclosed tests, significantly reducing the failure rate of the burn-in testing phase.

BRIEF DESCRIPTION OF THE SEVERAL VIEWS OF THE DRAWINGS

Preferred embodiments of the invention are described below with reference to the following accompanying drawings.

DETAILED DESCRIPTION OF THE INVENTION

Figure 1:
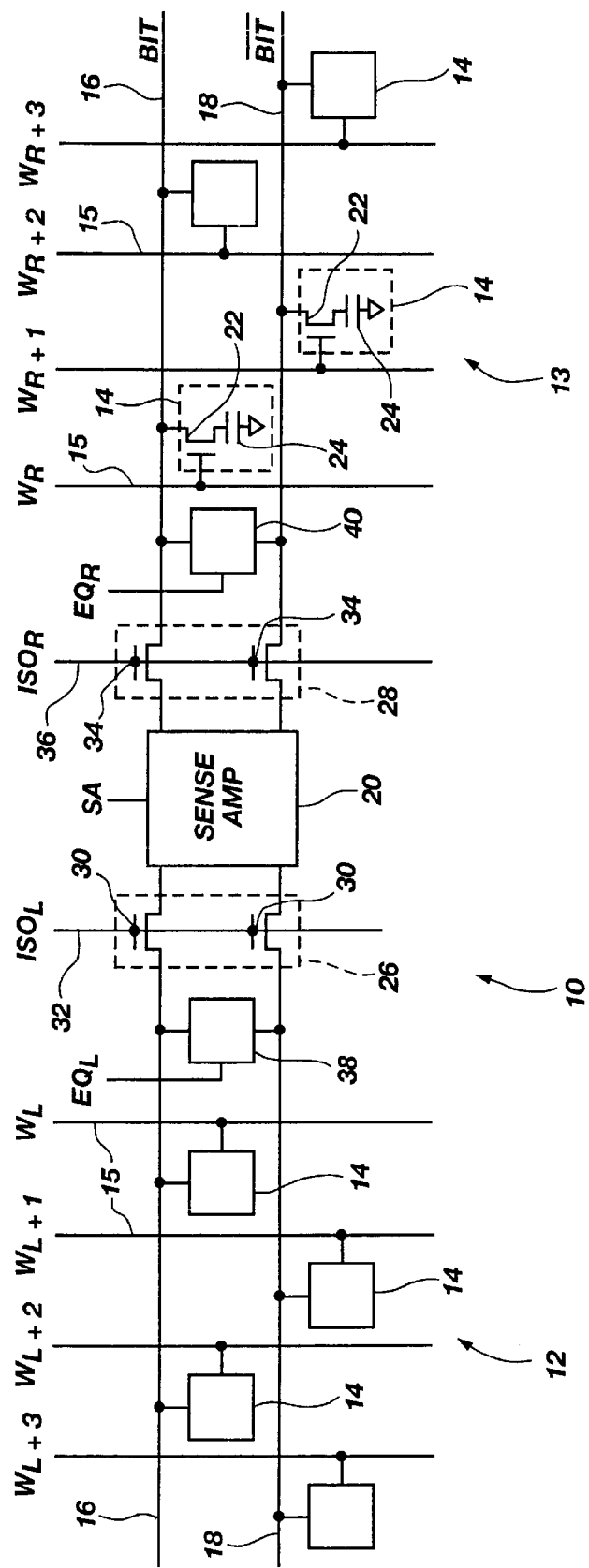
FIG. 1 is a schematic of a portion of a DRAM device and is used to describe the methods of the present invention.

This disclosure of the invention is submitted in furtherance of the constitutional purposes of the U.S. Patent Laws "to promote the progress of science and useful arts" (Article 1, Section 8).

According to one aspect, this invention comprises a method for testing a semiconductor memory device, the memory device having a plurality of memory cells accessible by a plurality of word lines and bit lines, the memory device having preparatory and control circuitry for preparing and selecting ones of the memory cells, word lines, and bit lines for a write or read operation, one set of the memory cells being coupled to a sense amplifier via at least one bit line, individual memory cells being configured to store an electrical charge indicative of a binary "1" or "0", the binary "1" or "0" being written to and read from the individual memory cell by applying a voltage level to a word line and applying or measuring a data voltage level indicative of a binary "1" or "0" on a bit line, the writing and reading occurring during a cycle of sequential timing signals that activates at least in part the sense amplifier, a word line, a bit line, and the preparatory and control circuitry, the timing signals within a cycle occurring in a sequential order at selected start times after commencement of the cycle, the timing signals having selected durations after their respective start times, the timing signals having selected voltage levels, the method for testing comprising the following steps:

writing and reading test information to and from the memory cells during a testing period;

during the testing period, controllably adjusting at least one of (1) the start times of the timing signals in relation to commencement of a cycle, (2) the durations of the timing signals, and (3) the voltage levels of the timing signals, the controlled adjustment of timings and voltage levels resulting in an alteration of the data voltage level on the bit line to be sensed by the sense amplifier such that, in a case that the memory device has a defect, the data voltage level will be altered to a degree that causes the sense amplifier to incorrectly sense the test information written to or read from a memory cell and to output an erroneous value;

comparing the test information input to and output from the memory cells; and generating an error signal if the test information read from the memory cells is not the same as the information written to the memory cells.

This and other aspects of the invention are described in more detail with reference to FIGS. 1 and 2. The present invention provides multiple methods for testing semiconductor memory devices. The methods described herein are suitable for DRAMs, SRAMs, and other memory devices derived from DRAMs and SRAMs, such as video RAMs and cache memory products. The testing methods of this invention can also be applied to one-time programmable memories such as ROMs, PROMs, and EPROMs, and also to many time-programmable devices, such as EEPROMs and flash memory.

Some of the testing methods described herein can also be used to evaluate non-memory semiconductor devices, such as microprocessors, gate arrays, and programmable logic arrays. While this invention is suitable for various types of semiconductor devices, explanation of the present invention will be made with reference to a memory device, and more particularly, to the DRAM device illustrated in FIGS. 1 and 2.

Figure 2:
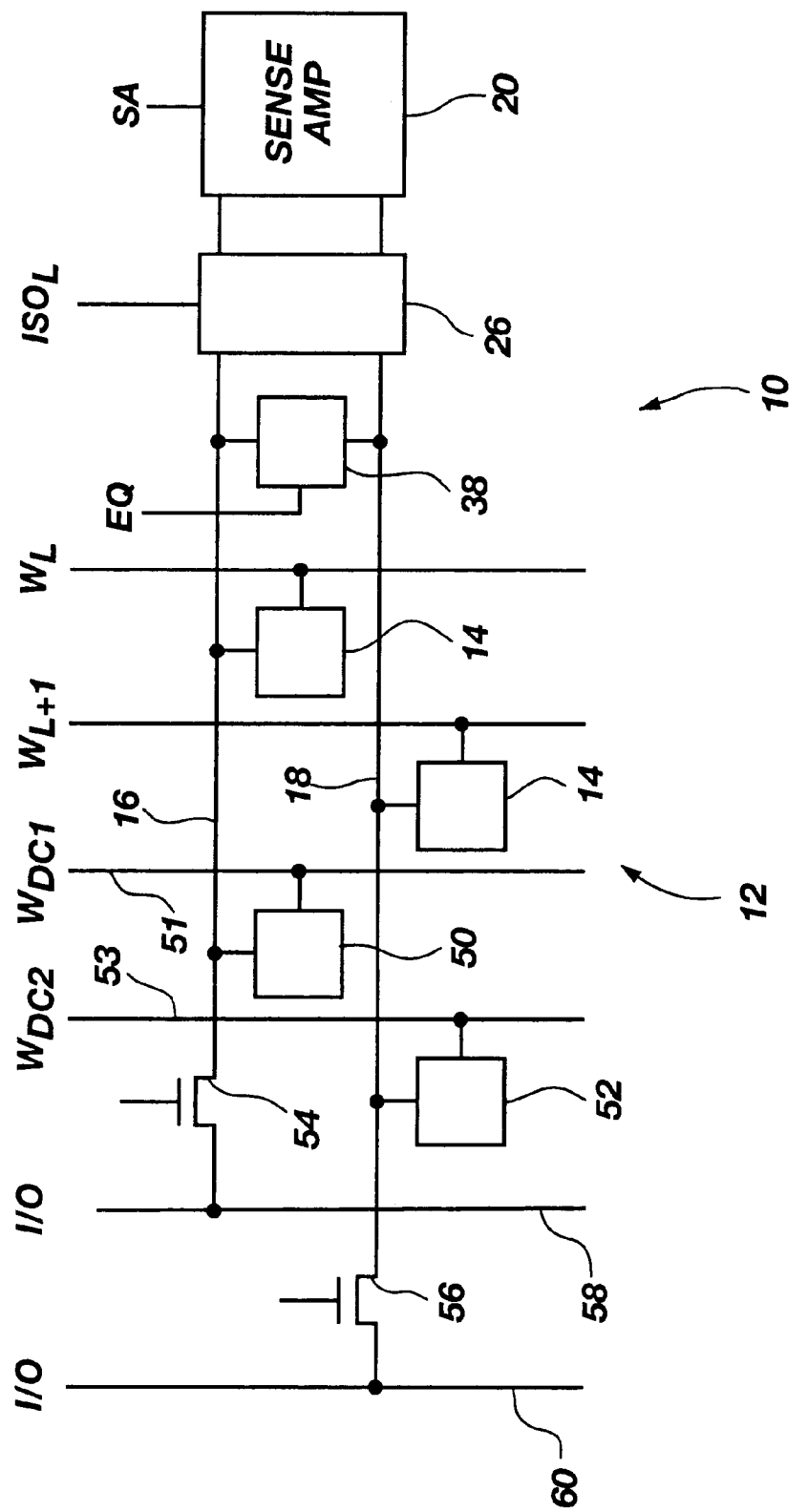
FIG. 2 is a schematic of another portion of the FIG. 1 DRAM device.

FIG. 1 shows a portion of a DRAM device or chip 10 having a first or left memory array 12 and a second or right memory array 13 of multiple individual memory cells 14. Individual memory cells 14 are accessible by a plurality of row or word lines 15 and a pair of complementary column or bit lines 16 and 18. Timing signals $W_L$, $W_{L+1}$, etc. are applied to word lines 15 for memory cells in the left array 12 and timing signals $W_R$, $W_{R+1}$, etc. are applied to word lines 15 for memory cells in the right array 13. Complementary bit lines 16 and 18 receive complementary data or information BIT and BIT.

Memory arrays 12 and 13 are coupled to a differential or sense amplifier 20 via bit lines 16 and 18. Sense amplifier 20 senses a voltage differential on bit lines 16 and 18, and increases the voltage differential to help external circuitry correctly identify the data being read from individual memory cells 14. Sense amplifier 20 is of conventional design and is not described in detail.

Individual memory cells 14 comprise an access transistor 22 and a storage capacitor 24. Such is typical design for a DRAM cell. Access transistor 22 has a gate coupled to a corresponding word line and a source/drain path coupled between a bit line and storage capacitor 24.

The memory cells are configured to store an electrical charge indicative of a binary "1" or "0". Binary data is written to and read from individual memory cells 14 by applying a voltage level to the desired word line and applying or measuring a data voltage level indicative of a binary "1" or "0" (data bit) on bit lines 16 or 18.

DRAM device 10 also comprises first or left isolation component 26 and second or right isolation component 28. Left isolation component 26 consists of a pair of transistors 30 having source/drain paths coupled in line with respective bit lines, and gates tied to a conductor 32. A signal $ISO_L$ is applied to conductor 32 to activate left isolation component 26. Similarly, right isolation component 28 consists of a pair of transistors 34 having source/drain paths coupled in line with respective bit lines, and gates coupled to a conductor 36. A signal $ISO_R$ is applied to conductor 36 to activate right isolation component 28. In this manner, activation signals $ISO_L$ and $ISO_R$ are provided to isolate the left and right memory arrays 12 and 13 of DRAM device 10, respectively. Isolation components 26 and 28 are described below in more detail.

DRAM device 10 has first or left equalizing circuit 38 for the left array of memory cells 12, and a second or right equalizing circuit 40 for the right array of memory cells 13. Equalizing circuits 38 and 40 are activated by timing signals $EQ_L$ and $EQ_R$, respectively. The equalizing circuits typically consist of one or more transistors with source/drain paths coupled between bit lines 16 and 18. Upon activation, equalizing circuits 38 and 40 bring the bit lines to equal voltages, such as Vcc/2. In this disclosure, the standard 5 V level is used as Vcc for purposes of explanation. However, other standard voltage levels, such as 3 V or 3.3 V, may be employed within the context of this invention.

DRAM device 10 also has preparatory and control circuitry for preparing and selecting individual memory cells 14, word lines 15, and bit lines 16 and 18 for a read or write operation. The preparatory and control circuitry includes isolation components 26 and 28 and equalizing circuits 38 and 40. The preparatory and control circuitry further includes decoders, address circuitry, pass gates, and the like, which are not illustrated in FIG. 1.

Figure 6:
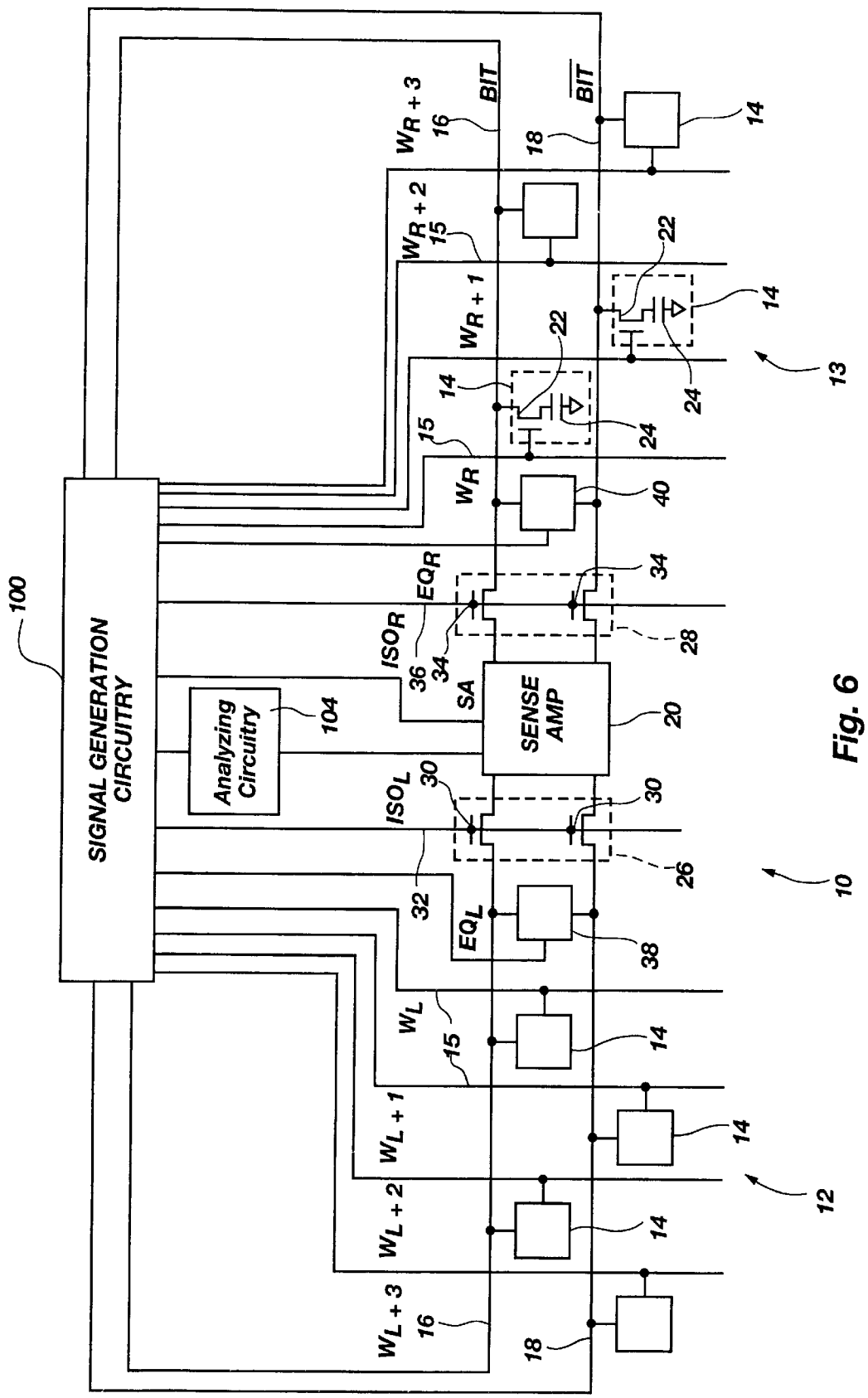
FIG. 6 is a schematic representation of a portion of a DRAM device in connection with signal generation and analyzing circuitry.

Referring to FIG. 6, signal generation and analysis circuitry 100 generates the timing signals and data signals for at least the portion of DRAM chip 10 shown in FIG. 1, and analyzing circuitry 104 considers the results of sense amplifier 20, the data written into individual memory cells 14, and the adjustment of the timing signals to discern defects in DRAM chip 10. Signal generation and analyzing circuitry 100 may include certain well known preparatory and control circuitry, which are not expressly illustrated in FIG. 1.

Figure 3:
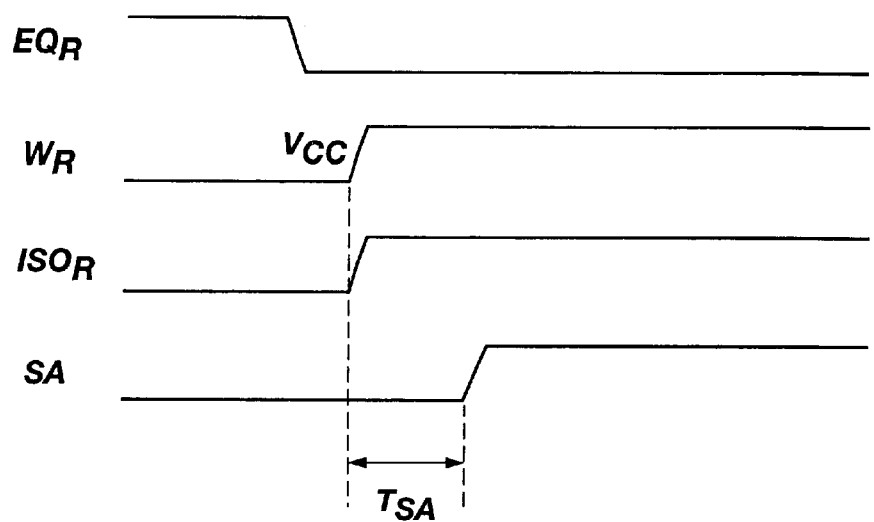
FIG. 3 is a timing diagram illustrating normal operation of the FIG. 1 DRAM device.

The operation of DRAM device 10 during its normal operative mode is described with reference to FIGS. 1 and 3. Writing and reading operations occur during a cycle of sequential timing signals that activate the sense amplifier, word lines, bit lines, and preparatory and control circuitry. The timing signals within any given read or write cycle occur in a sequential order at selected start times after commencement of the cycle. The timing signals have selected durations after their respective start times and selected voltage levels (typically digital voltage levels of 0 V or 5 V). The timing signals for operating the right array of memory cells 13 is illustrated in FIG. 3. The cycle begins when the timing signal ($EQ_R$) for the equalizing circuit 40 changes states. Prior to this time, the equalization circuit was activated and the complementary bit lines 16 and 18 were equalized to the same voltage level of approximately Vcc/2. In approximately 5 ns after the cycle start time, the timing signal ($W_R$) for activating a word line 15 commences. (The word line receiving activation signal $W_R$ is used for explanation purposes as it is representative of the word lines.) The word line activation signal typically (i.e., in operation) rises to a voltage level of Vcc (approximately 5 V). The timing signal ($ISO_R$) for right isolation component 28 commences almost simultaneously with the word line activation signal $W_R$.

When the word line activation signal $W_R$ achieves a voltage of Vcc, access transistor 22 of memory cell 14 is turned "on" so that the electrical charge stored on capacitor 24 can be transferred to bit line 16 to alter the data voltage level on that line. A typical storage capacitor of a DRAM cell holds approximately 100 mV. Accordingly, for a binary "1", for example, bit line 16 is changed from 2.5 V (Vcc/2) to approximately 2.6 V. Meanwhile, complementary bit line 18 remains at 2.5 V.

The charge on storage capacitor 24 is not instantaneously placed on bit line 16, but requires a finite duration of time in accordance with the RC time constant established by access transistor 22 and storage capacitor 24. For this reason, sense amplifier 20 is not activated until a time TSA after word line activation signal $W_R$ (FIG. 3). In normal operation, time TSA is approximately 5–10 ns. Sense amplifier 20 detects the minor voltage differential of 2.6 V on bit line 16 and 2.5 V on bit line 18, and further increases this differential (for example, by bringing down the voltage on bit line 18 toward ground) so that the information may be more easily detected by decode circuitry (not shown).

According to this invention, the DRAM device is manipulated by changing the timing patterns and voltage levels of timing signals in an effort to stress the individual memory cells to such an extent that erroneous voltage levels, and thus inaccurate voltage differentials, appear on complementary bit lines 16 and 18. That is, instead of allowing the memory device to run within its intended margins of operation (such as timing sequence, signal voltage levels, and timing signal durations), the tests of this invention manipulate the operational margins to reveal weaknesses in the memory device which can cause errors that become manifested as erroneous voltage levels on the bit lines. When such erroneous values occur, sense amplifier 20 detects and further exaggerates the improper differential, thereby incorrectly detecting the information stored in the individual memory cells 14.

The tests of this invention are conducted early in the manufacturing process after initial fabrication of the memory devices. Common problems associated with memory devices that induce failure include highly resistant paths, inadequately formed capacitor cells, and parasitic capacitances. Such tests reveal potential defects which are today typically manifested during the exhaustive burn-in testing stage which occurs after the dice have been severed and individually packaged or by conducting lengthy pattern testing after packaging. By conducting the early tests, potential problem devices may be cured with redundant components prior to singulation and individual packaging. On the other hand, if the die cannot be saved through redundancy, the die can be scrapped before additional expense is incurred during the packaging stage.

According to the invention, test information is written to and read from the memory cells during a testing period. During this testing period, a test engineer controllably adjusts one or more of the following parameters: (1) the start times of the timing signals in relation to commencement of a read or write cycle, (2) the durations of the timing signals, and (3) the voltage levels of the timing signals. Controllably adjusting the timings and voltage levels of these signals stresses the DRAM device in such a manner to induce alteration in the data voltage level placed on one of the complementary bit lines 16 and 18 to be sensed by sense amplifier 20. In a situation where the memory device has a defect, the data voltage level is altered to such an extent that the sense amplifier, although correctly sensing the voltage differential on bit lines 16 and 18, incorrectly senses the test information or test bit written to or read from an individual memory cell. The sense amplifier 20 increases the voltage differential on bit lines 16 and 18 in the wrong manner as compared to the stored information, and thus outputs an erroneous value. The test information input to and output from the memory cells is continuously monitored and compared. An error signal is generated if the test information read from the memory cells is not the same as the information written to the memory cells.

Specific testing methods according to this invention will now be described with reference to FIGS. 1–4. According to one aspect of the invention, the timing signal used to fire sense amplifier 20 is adjusted, and preferably reduced, to reveal weaknesses in individual memory cells and/or the sense amplifier. As shown in FIG. 3, the sense amplifier is normally activated a time TSA after word line activation signal $W_R$. Time $T_{SA}$ is typically approximately 5–10 ns. Upon activation of the word line, the electrical charge stored on storage capacitor 24 is passed through access transistor 22 to create a data voltage level on bit line 16, whereby the data voltage level is indicative of the test information or electrical charge stored in the accessed individual memory cell 14.

Figure 4:
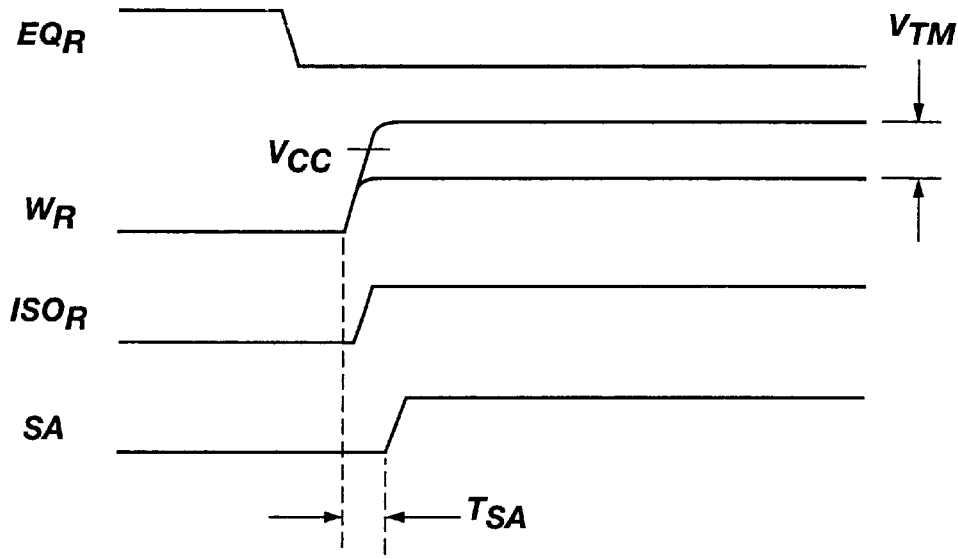
FIG. 4 is a timing diagram illustrating operation of the FIG. 1 DRAM device during test modes of this invention.

According to this first test method, the commencement of activating the sense amplifier relative to commencement of activating the word line is controllably adjusted to alter the temporal duration therebetween. This is illustrated in FIG. 4 wherein time duration TSA is significantly shortened. Shortening this time duration intentionally stresses the time required to transfer the electrical charge from storage capacitor 24 to corresponding bit line 16.

For example, suppose that storage capacitor 24 holds an electrical charge indicative of a binary "1". Additionally, assume that due to a defect, storage capacitor 24 has only 50% of its intended capacity. In this situation, the charge stored on the capacitor will not be adequately transferred to the bit line to raise the data voltage level thereon a sufficient amount (such as 100 mV) that is recognized by sense amplifier 20. Accordingly, the sense amplifier, although properly reading the voltage differential on bit lines 16 and 18, will incorrectly sense the test information stored in the accessed memory cell because rather than reading a binary "1", the sense amplifier may mistake the voltage differential as representing a binary "0". The memory device is monitored to identify when the sense amplifier incorrectly senses the test information in an effort to identify early weak or defective components of the device.

In the preferred embodiment, the temporal duration $T_{SA}$ is reduced to a range of approximately 1–5 ns, with a duration of approximately 1–2 ns being most preferred.

According to another aspect of this invention, the activation voltage applied to the word lines can be controllably changed in such a manner that stresses the normal operating conditions of the memory device. As illustrated in FIG. 4, the test mode voltage level $V_{TM}$ of timing signal $W_R$ is preferably adjusted within a range of 20%–30% above and below normal operating levels in an effort to reveal latent defects. For the standard 5 volt level, such a range is equivalent to 3.5 V to 6.5 V. For example, assume that the voltage applied to word line 15 is changed to approximately 4 V. This voltage level will not fully turn "on" access transistor 22, thereby partially inhibiting the discharge or transfer of voltage from storage capacitor 24 onto bit line 16. If the memory device has a defect, the data voltage level on the bit line will be altered to a degree that causes the sense amplifier to incorrectly sense the test information stored in the accessed individual memory cell 14.

A variation of this last test procedure is to selectively alter the voltage applied to various regions or components of a semiconductor device. Typically, most components of an integrated circuit receive digital voltage levels of ground or Vcc. A test method of this invention could be applied to an integrated circuit whereby certain regions or components of the circuit receive a different voltage as compared to the remaining portions of the circuit. For example, a first voltage could be applied to components in a first region of the semiconductor device (for instance, the memory portion of a microprocessor) and a second voltage could be applied to components in a second region of the semiconductor device (for instance, the logic and operational circuitry of the microprocessor). The first voltage could then be controllably adjusted to stress operation of the components in the first region such that, if the semiconductor device has a defect, the semiconductor device will fail.

According to another aspect of this invention, both isolation components 26 and 28 are activated simultaneously to increase bit line capacitance. This technique is contra to normal operation of the DRAM device. During normal operation, first isolation component 26 is activated and second isolation component 28 is deactivated when one of the memory cells from the left memory array 12 is accessed. In this manner, the capacitance on bit lines 16 and 18 extending to the right memory array 13 of memory cells is not permitted to affect sense amplifier 20. This allows the sense amplifier to concentrate only on the bit lines extending to the left thereof. Similarly, when a memory cell of the right memory array 13 is accessed, second isolation component 28 is activated and first isolation component 26 is deactivated.

However, according to this testing method, both isolation components 26 and 28 are turned "on" to increase, or effectively double, the capacitance on the complementary bit lines 16 and 18, thereby reducing the memory cell's ability to modify the data voltage level on a corresponding bit line. Therefore, if the memory device has a latent defect, the transfer of test information from a memory cell to the bit line will not be sufficiently adequate to induce the appropriate voltage differential on the complementary bit line. As a result, sense amplifier 20 will incorrectly sense the test information stored in the accessed memory cell.

The above three testing procedures attempt to manifest errors during a read cycle. Another testing method of this invention seeks to reveal defects during a write operation. To write test information to a memory cell, a selected word line is activated to access the memory cell. Next, the test data is written onto the bit line coupled to the accessed memory cell such that the data is transferred through the access transistor and stored on the capacitor. Thereafter, the word line is deactivated. During the test cycle, the test information pattern is preferably alternating binary "is" and "0s". Accordingly, a binary "1" is written to a memory cell during the first write cycle, a binary "0" is written to the memory cell during the second write cycle, a binary "1" is again written to the memory cell during a third write cycle, and so on.

According to the test method of this invention, the cycle time duration of this write operation is controllably adjusted to effect transfer of the charge from the bit lines to the storage capacitor. Preferably, the cycle time duration is reduced to less than approximately 10 ns, with a cycle time duration of less than approximately 6 ns being most preferred. As a result of the shortened write operation cycle times, an appropriate amount of charge may not be transferred to the memory cells, a condition that is exacerbated when the memory device has a defect. Accordingly, when these memory cells are later read, the storage capacitor is not able to transfer an adequate amount of voltage to the bit line and, thus, the sense amplifier will effectively incorrectly sense the test information stored in the accessed memory cell as compared to the information that was actually written to the memory cell during the modified write cycle.

The remaining testing methods of this invention will be described with reference to FIG. 2, which shows the left memory array 12 of individual memory cells 14. DRAM device 10 has a pair of dummy memory cells 50 and 52 formed at the end of left memory array 12. First or upper dummy memory cell 50 is coupled between upper bit line 16 and word line 51. Timing signal $W_{DC1}$ is applied to word line 51. Similarly, second or lower dummy cell 52 is coupled between bit line 18 and word line 53. Timing signal $W_{DC2}$ is applied to word line 53. Bit lines 16 and 18 are coupled to input/output lines 58 and 60 via respective pass gates 54 and 56.

During normal operation, the dummy memory cells 50 and 52 are provided to cancel or eliminate noise inherent in memory devices. More specifically, upper dummy cell 50 is activated when a memory cell coupled to lower complementary bit line 18 is accessed. Likewise, lower dummy cell 52 is activated when a memory cell coupled to upper bit line 16 is accessed. The upper and lower dummy memory cells add corrective voltages to the complementary bit lines to compensate for detrimental stray voltages introduced inherently onto the bit line coupled to the selected memory cell.

The stray voltages come from the parasitic capacitance between the word line and the digit line.

For example, if the accessed individual memory cell 14 of left memory array 12 stored a binary "1", the electric charge would raise the data voltage level on a bit line (for example, bit line 16) by a value of approximately 100 mV. However, additional stray voltages inherent in the memory device may cause that voltage to be 10–20 mV higher. Accordingly, a dummy memory cell on the opposing complementary bit line is activated to counterbalance the 10–20 mV of stray voltage so that the sense amplifier can detect a clean 100 mV differential.

Not all memory devices employ dummy memory cells. Such cells are only used in situations where the inherent imbalance induced on the bit lines is substantial. For those memory cells which have additional dummy memory cells, another testing method of this invention conducts a series of writing and reading operations while preventing activation of the dummy memory cells. More specifically, when a memory cell coupled to upper bit line 16 is read from during the testing period, the test method precludes activation of lower dummy memory cell 52. In this manner, the stray voltages are intentionally left on the bit lines to be sensed by sense amplifier 20. Preventing activation of the second dummy memory cell denies introduction of the corrective voltage. If the memory device has a defect, the difference between the voltage levels on the two bit lines will be substantially varied as compared to the difference in normal voltage levels had the dummy memory cell been accessed. The sense amplifier will therefore incorrectly sense test information stored on the accessed memory cell.

Another test of this invention is to purposely activate the wrong dummy memory cell to further imbalance the voltage differential on bit lines 16 and 18. According to this method, when an individual memory cell 14 coupled to upper bit line 16 is accessed, upper dummy memory cell 50 is activated while lower dummy memory cell 52 is prohibited from being activated. This method further exacerbates this problem by "correcting" the bit line voltage differential on the wrong bit line. Again, if there is a defect in the memory device, the data voltage level on the bit line will be altered a significant degree such that sense amplifier 20 incorrectly senses the test information stored in the accessed individual memory cell 14.

Figure 5:
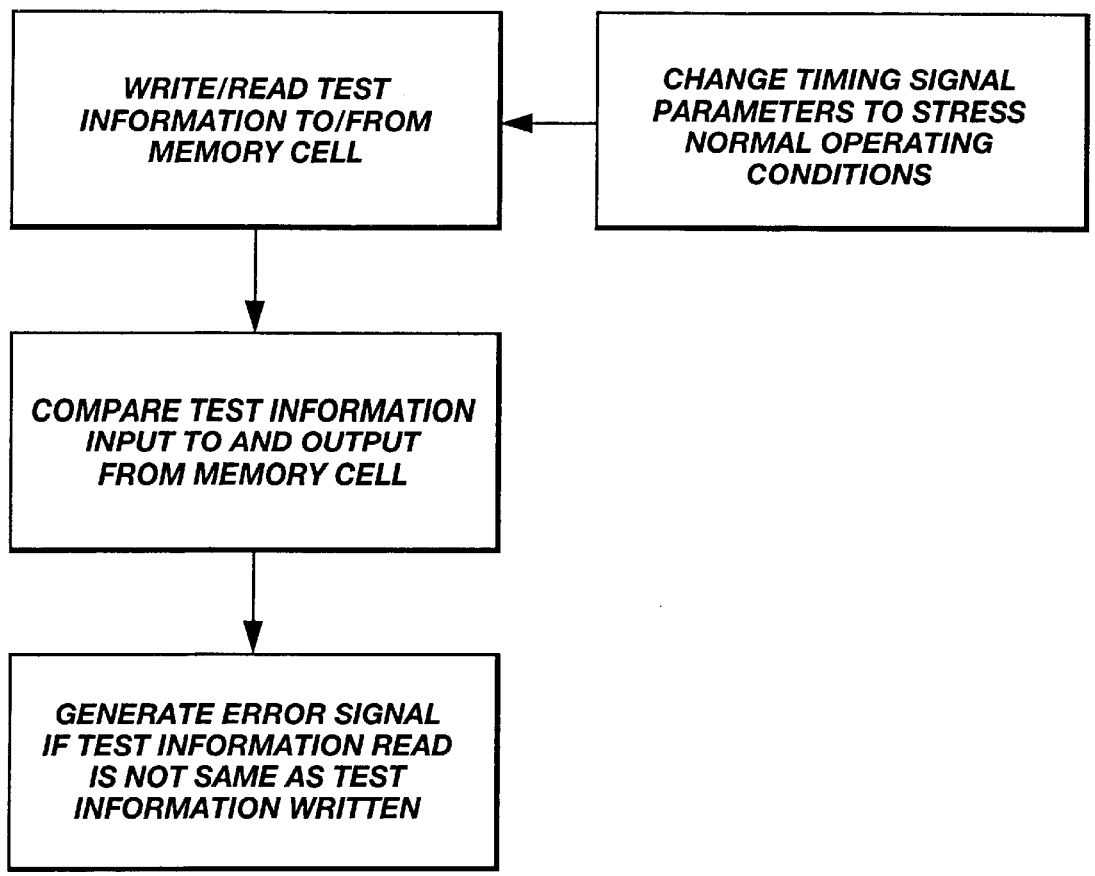
FIG. 5 is a network chart illustrating the method steps of the invention.

All of the above testing methods effectively steal voltage differential from sense amplifier 20. FIG. 5 illustrates the general method steps of the above detailed invention. Some methods shorten timing signals or commencement of those signals relative to other timing signals, while other methods adjust voltage levels of certain timing signals. Each of the tests described above permit an efficient testing of semiconductor dice early in the manufacturing stage. The tests reveal potential defects prior to the packaging step of the manufacturing process so that, if correctable, the redundant memory cells may be fused to replace defective memory cells. On the other hand, if the memory device cannot be saved, it is discarded before the manufacturer incurs any additional expense in packaging the device.

As an alternative way of viewing this invention, the testing methods described herein stress the semiconductor device by purposefully changing the timing signals to the limits, or outside, of their intended parameters associated with normal operation. For example, a semiconductor device typically comprises multiple transistors that are accessible by many conductive lines, whereby sets or groups of transistors are configured in specified arrangements to perform associated selected operations. The conductive lines carry multiple timing signals of certain time durations and voltage levels that are employed to run the semiconductor device. These time durations and voltage levels have ideal values and the semiconductor device operates in a normal mode when the time durations and voltage levels are within specified margins of their respective ideal values. These margins encompass a range of values (which includes the ideal values) between upper and lower value boundaries.

A test of this invention stresses the semiconductor device by controllably adjusting either or both of (1) the time durations of the timing signals or (2) the voltage levels of the timing signals so that the time durations and voltage levels approach certain values at or beyond the value boundaries of the specified margin. This controlled adjustment causes an alteration of the semiconductor device operation such that, if the semiconductor device has a defect, the semiconductor device will fail. Such failed devices can then be identified.

The testing methods of this invention are advantageous because they may be conducted in a relatively short time frame. Many of these tests can be performed in much less time than the conventional burn-in testing process. The test patterns are shorter in duration and the process of "detuning" or stressing the devices will more easily and efficiently identify weak or defective cells and/or other circuitry.

Where appropriate, the testing methods of this invention can be used in addition to burn-in testing to add a secondary level of testing which quickly weeds out marginal defective devices before these devices are discovered during the forty-eight hour burn-in testing phase. As a result, burn-in testing is conducted only on those chips which have proven satisfactory in the above tests, significantly reducing the failure rate of the burn-in testing phase.

Another significant advantage is that the tests of this invention identify defective failed components or weak components that are likely to fail before assembly. As a result of this early detection, redundant elements can be engaged to save the devices and prevent them from failing later.

In compliance with the statute, the invention has been described in language more or less specific as to structural or methodical features. It is to be understood, however, that the invention is not limited to the specific features described or shown, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for testing a memory device, the method comprising:

writing test information to at least one memory cell;

reading the test information from the at least one memory cell; and manipulating at least one operational margin of the memory device during at least one of writing to and reading from the at least one memory cell.

2. The method of claim 1, further comprising:

comparing the test information read from the at least one memory cell with the test information written to the at least one memory cell; and determining if the at least one memory cell is defective in response to the test information comparison.

3. The method of claim 1, wherein manipulating at least one operational margin of the memory device comprises manipulating a start time of a timing signal in relation to commencement of the at least one of the writing to and reading from the at least one memory cell.

4. The method of claim 3, wherein manipulating the start time of the timing signal comprises adjusting the start time of the timing signal from a time range between 5 and 10 nanoseconds after a word line activation signal to starting within a time range between 1 and 5 nanoseconds after the word line activation signal.

5. The method of claim 4, further comprising adjusting the start time of the timing signal to a time range between 1 and 2 nanoseconds after the word line activation signal.

6. The method of claim 1, wherein manipulating the at least one operational margin of the memory device comprises manipulating a duration of a timing signal.

7. The method of claim 1, wherein manipulating the at least one operational margin of the memory device comprises manipulating a voltage level of a timing signal in relation to an operating voltage for the memory device.

8. The method of claim 7, wherein manipulating the voltage level of the timing signal comprises manipulating the voltage level within a range of 30% above and 30% below the operational voltage level.

9. The method of claim 7, wherein manipulating the voltage level of the timing signal comprises manipulating the voltage level within a range of 3.5 volts to 6.5 volts.

10. The method of claim 7, wherein the at least one memory cell comprises a plurality of memory cells and manipulating the voltage level of the timing signal comprises altering a voltage level applied to a first memory cell of the plurality of memory cells with respect to a voltage level applied to a second memory cell of the plurality of memory cells.

11. The method of claim 7, wherein manipulating the voltage level of the timing signal comprises applying a first voltage level to a first component of the memory device and applying a second voltage level to a second component of the memory device.

12. The method of claim 11, wherein applying the first voltage level to the first component of the memory device comprises applying a first voltage level to an operational circuitry portion of the memory device, and applying the second voltage level to the second component of the memory device comprises applying a second voltage level to a memory portion of the memory device.

13. The method of claim 1, wherein manipulating the at least one operational margin of the memory device comprises simultaneously activating two isolation components associated with the memory device.

14. The method of claim 1, wherein manipulating the at least one operational margin of the memory device comprises manipulating one of a writing cycle duration or a reading cycle duration.

15. The method of claim 14, wherein manipulating one of a writing cycle duration or a reading cycle duration comprises shortening the duration.

16. The method of claim 1, wherein manipulating the at least one operational margin of the memory device comprises preventing activation of a dummy memory cell coupled to an upper bit line of the memory device while writing to and reading from one of the at least one memory cell coupled to a lower bit line of the memory device.

17. The method of claim 1, wherein manipulating the at least one operational margin of the memory device comprises preventing activation of a dummy memory cell coupled to a lower bit line of the memory device while writing to and reading from one of the at least one memory cell coupled to an upper bit line of the memory device.

18. The method of claim 1, wherein manipulating the at least one operational margin of the memory device comprises activating a dummy memory cell coupled to a bit line while writing to or reading from one of the at least one memory cell coupled to the same bit line.

19. A semiconductor device comprising:
at least one word line;
at least one bit line;
at least one memory cell, each of the at least one memory cell coupled to one of the at least one word line and to one of the at least one bit line; and
circuitry coupled to at least one of the at least one word line and the at least one bit line for manipulating at least one operational margin of the semiconductor device during at least one of writing to the at least one memory cell and reading from the at least one memory cell.

20. The semiconductor device of claim 19, wherein the circuitry coupled to at least one of the at least one word line and the at least one bit line comprises circuitry for manipulating a start time of a timing signal in relation to commencement of at least one of the writing to and the reading from the at least one memory cell.

21. The semiconductor device of claim 20, wherein the circuitry for manipulating the start time of the timing signal comprises circuitry for adjusting the start time of the timing signal from a time range between 5 and 10 nanoseconds after a word line activation signal to starting within a time range between 1 and 5 nanoseconds after the word line activation signal.

22. The semiconductor device of claim 21, wherein the circuitry is configured to adjust the start time of the timing signal to a time range between 1 and 2 nanoseconds after the word line activation signal.

23. The semiconductor device of claim 19, wherein the circuitry coupled to at least one of the at least one word line and the at least one bit line comprises circuitry configured for manipulation of the duration of a timing signal.

24. The semiconductor device of claim 19, wherein the circuitry coupled to at least one of the at least one word line and the at least one bit line comprises circuitry for manipulating a voltage level of a timing signal in relation to an operating voltage for the memory device.

25. The semiconductor device of claim 24, wherein the circuitry for manipulating the voltage level of the timing signal comprises circuitry configured to manipulate the voltage level within a range of 30% above and 30% below an operational voltage level.

26. The semiconductor device of claim 24, wherein the circuitry for manipulating the voltage level of the timing signal comprises circuitry configured to manipulate the voltage level within a range of 3.5 volts to 6.5 volts.

27. The semiconductor device of claim 24, wherein the at least one memory cell comprises a plurality of memory cells and the circuitry for manipulating the voltage level of the timing signal comprises circuitry configured to alter a voltage level applied to a first memory cell of the plurality of memory cells with respect to a voltage level applied to a second memory cell of the plurality of memory cells.

28. The semiconductor device of claim 24, wherein the circuitry for manipulating the voltage level of the timing signal comprises circuitry configured to apply a first voltage level to a first component of the memory device and to apply a second voltage level to a second component of the memory device.

29. The semiconductor device of claim 28, wherein the circuitry configured to apply the first voltage level to the first component of the memory device and to apply a second voltage level to a second component of the memory device comprises circuitry configured to apply a first voltage level to an operational circuitry portion of the memory device and to apply a second voltage level to a memory portion of the memory device.

30. The semiconductor device of claim 19, wherein the circuitry coupled to the at least one of the at least one word line and the at least one bit line comprises circuitry for simultaneously activating two isolation components associated with the memory device.

31. The semiconductor device of claim 19, wherein the circuitry coupled to the at least one of the at least one word line and the at least one bit line comprises circuitry for manipulating one of a writing cycle duration or a reading cycle duration.

32. The semiconductor device of claim 31, wherein the circuitry for manipulating the one of a writing cycle duration or a reading cycle duration comprises circuitry for shortening the duration.

33. The semiconductor device of claim 19, wherein the circuitry coupled to the at least one of the at least one word line and the at least one bit line comprises circuitry for preventing activation of a dummy memory cell coupled to an upper bit line of the memory device while writing to and reading from one of the at least one memory cell coupled to a lower bit line of the memory device.

34. The semiconductor device of claim 19, wherein the circuitry coupled to the at least one of the at least one word line and the at least one bit line comprises circuitry for preventing activation of a dummy memory cell coupled to a lower bit line of the memory device while writing to and reading from one of the at least one memory cell coupled to an upper bit line of the memory device.

35. The semiconductor device of claim 19, wherein the circuitry coupled to the at least one of the at least one word line and the at least one bit line comprises circuitry for activating a dummy memory cell coupled to a bit line while writing to or reading from one of the at least one memory cell coupled to the same bit line.

* * * * *

UNITED STATES PATENT AND TRADEMARK OFFICE
CERTIFICATE OF CORRECTION

PATENT NO. : 6,230,292 B1
APPLICATION NO. : 09/451172
DATED : May 8, 2001
INVENTOR(S) : Duesman et al.

It is certified that error appears in the above-identified patent and that said Letters Patent is hereby corrected as shown below:

On the title page:
(54): change "DEVICES AND METHOD FOR TESTING CELL MARGIN OF MEMORY DEVICES" to -- DEVICES AND METHODS FOR TESTING CELL MARGIN OF MEMORY DEVICES--

On Title Page
In U.S. References Cited
section (56)
2nd column, 14th line: change "5,315,554 * 5/1994 Namba" to --5,315,554 * 5/1994 Nanba--

| | | |
|---|---|---|
| COLUMN 1, | LINE 1, | change "DEVICES AND METHOD FOR TESTING CELL MARGIN OF MEMORY DEVICES" to -- DEVICES AND METHODS FOR TESTING CELL MARGIN OF MEMORY DEVICES-- |
| COLUMN 1, | LINE 58, | change "bum-in" to --burn-in-- |
| COLUMN 2, | LINE 1, | change "bum-in" to --burn-in-- |
| COLUMN 2, | LINE 6, | change "bum-in" to --burn-in-- |
| COLUMN 2, | LINE 34, | change "bum-in" to --burn-in-- |
| COLUMN 2, | LINE 52, | change "bum-in" to --burn-in-- |
| COLUMN 4, | LINE 18, | change second occurrence of "BIT" to --$\overline{BIT}$-- |
| COLUMN 5, | LINE 53, | change "TSA" to --$T_{SA}$-- |
| COLUMN 5, | LINE 55, | change "TSA" to --$T_{SA}$-- |
| COLUMN 6, | LINE 54, | change "TSA" to --$T_{SA}$-- |
| COLUMN 6, | LINE 66, | change "TSA" to --$T_{SA}$-- |

UNITED STATES PATENT AND TRADEMARK OFFICE
CERTIFICATE OF CORRECTION

PATENT NO. : 6,230,292 B1
APPLICATION NO. : 09/451172
DATED : May 8, 2001
INVENTOR(S) : Duesman et al.

It is certified that error appears in the above-identified patent and that said Letters Patent is hereby corrected as shown below:

COLUMN 8, LINE 24, change "is" to --"1s"--

Signed and Sealed this

Eighth Day of August, 2006

JON W. DUDAS
*Director of the United States Patent and Trademark Office*